United States Patent
Zhang et al.

(10) Patent No.: US 11,605,641 B2
(45) Date of Patent: Mar. 14, 2023

(54) FLASH DEVICE AND MANUFACTURING METHOD THEREOF

(71) Applicant: CSMC TECHNOLOGIES FAB2 CO., LTD., Wuxi (CN)

(72) Inventors: Song Zhang, Wuxi (CN); Zhibin Liang, Wuxi (CN); Yan Jin, Wuxi (CN); Dejin Wang, Wuxi (CN)

(73) Assignee: CSMC TECHNOLOGIES FAB2 CO., LTD., Wuxi (CN)

( * ) Notice: Subject to any disclaimer, the term of this patent is extended or adjusted under 35 U.S.C. 154(b) by 178 days.

(21) Appl. No.: 17/257,087

(22) PCT Filed: Oct. 12, 2019

(86) PCT No.: PCT/CN2019/110725
§ 371 (c)(1),
(2) Date: Dec. 30, 2020

(87) PCT Pub. No.: WO2020/078275
PCT Pub. Date: Apr. 23, 2020

(65) Prior Publication Data
US 2021/0126001 A1  Apr. 29, 2021

(30) Foreign Application Priority Data

Oct. 15, 2018 (CN) .......................... 201811195846.X

(51) Int. Cl.
*H01L 27/11521* (2017.01)
(52) U.S. Cl.
CPC .............................. *H01L 27/11521* (2013.01)
(58) Field of Classification Search
CPC ......... H01L 27/11521; H01L 29/42324; H01L 29/788; H01L 29/7881
See application file for complete search history.

(56) References Cited

U.S. PATENT DOCUMENTS

| 5,614,429 A | * | 3/1997 | Shin | ................... | H01L 29/42324 |
| | | | | | 257/E27.103 |
| 6,468,863 B2 | * | 10/2002 | Hsieh | .................... | H01L 27/115 |
| | | | | | 438/257 |
| 7,320,913 B2 | * | 1/2008 | Kang | ................ | H01L 29/42328 |
| | | | | | 438/257 |

FOREIGN PATENT DOCUMENTS

| CN | 106298793 | 1/2017 |
| CN | 106601608 | 4/2017 |
| EP | 0430829 | 6/1991 |

OTHER PUBLICATIONS

International Search Report (w/ English translation) & Written Opinion for corresponding PCT Application No. PCT/CN2019/110725, dated Jan. 7, 2020—8 pages.

* cited by examiner

*Primary Examiner* — Allison Bernstein
(74) *Attorney, Agent, or Firm* — Dority & Manning, PA

(57) ABSTRACT

A flash device and a manufacturing method thereof. The method comprises: providing a substrate, and forming, on the substrate, a floating gate polycrystalline layer, a floating gate oxide layer, and a tunneling oxide layer; wherein the floating gate polycrystalline layer is formed on the substrate, the floating gate oxide layer is formed between the substrate and the floating gate polycrystalline layer, a substrate region at one side of the floating gate polycrystalline layer is a first substrate region, a substrate region at the other side of the floating gate polycrystalline layer is a second substrate region; forming, on the tunneling oxide layer, located in the first substrate region, a continuous non-conductive layer, the non-conductive layer extending to the tunneling oxide layer at a side wall of the floating gate polycrystalline layer; and forming, on the tunneling oxide layer, a polysilicon layer.

14 Claims, 3 Drawing Sheets

FLASH DEVICE AND MANUFACTURING
METHOD THEREOF

CROSS REFERENCE TO RELATED
APPLICATIONS

This application claims priority to Chinese patent application No. 201811195846.X, entitled "FLASH DEVICE AND MANUFACTURING METHOD THEREOF", and filed on Oct. 15, 2018, the content of which is herein incorporated in its entirety by reference.

TECHNICAL FIELD

The present disclosure relates to the field of the flash technology, and particularly to a method of manufacturing a flash device and a flash device.

BACKGROUND

Flash memory, generally referred to as flash, is a non-volatile memory, which can retain data for a long time without current supply. This storage characteristics enables flash to be the basis of storage media of various digital devices.

In the process of manufacturing a flash device, floating gates spaced to each other will be first formed. Next, a wordline above the floating gates is formed by depositing polysilicon. For example, FIG. 1 is a diagram showing floating gates and a wordline, observed by a microscope, of a flash device in the prior art. Since the deposition of the polysilicon does not have selectivity, gaps between the floating gates can also be covered by the polysilicon. Then, when removing the superfluous polysilicon to form the wordline, the polysilicon in these gaps also needs to be removed. Generally, the superfluous polysilicon is removed by an etching process. However, due to the limitation of the etching process, it is difficult to completely remove the polysilicon deposited at the bottom of the floating gates, especially the polysilicon deposited at the bottom proximate to the side walls of the floating gates, which will result in the polysilicon residues, as shown in FIG. 1. For example, FIG. 1 is a schematic diagram showing the polysilicon residues, observed by the microscope, of the current flash device. In FIG. 1, FG denotes a floating gate, WL denotes a wordline, and poly residue denotes polysilicon residues.

Moreover, in the process of manufacturing a flash device, isolating trenches are generally formed at two sides of a floating gate. When the isolating trenches are filled, a divot structure can be formed in the isolating trenches. The polysilicon can also be deposited in the divot structure, since the deposition of the polysilicon does not have selectivity. When the superfluous polysilicon is etched to form the wordline, it is, however, difficult to etch off the polysilicon in the divot structure, which can result in the polysilicon residues at the bottom of the floating gates.

Both of the above conditions result in the polysilicon residues at the bottom of the floating gates. The residual polysilicon is conductive, which will consequently affect the data-erasing or data-writing in flash, so the performance of the manufactured flash device will be degraded.

The conventional methods of removing the polysilicon residue is to continuously adjust the process of etching poly silicon to remove the polysilicon residue. However, it is still difficult for these methods to completely clean up the polysilicon residue deposited at the bottom of the floating gates, even if expending more time and costs.

Moreover, to reduce the polysilicon residue at the bottom of the floating gates as much as possible, the etching period of time must increase, which can damage the active region, even resulting in fractures, and damage the contours of the polysilicon structures, such as the wordline, the floating gates, or the like.

SUMMARY

In view of this, it is necessary to provide a flash device and a method of manufacturing the same.

A method of manufacturing a flash device is provided, including:

providing a substrate, a floating gate polycrystalline layer, a floating gate oxide layer, and a tunneling oxide layer being formed on the substrate; the floating gate polycrystalline layer being formed on the substrate, the floating gate oxide layer being formed between the substrate and the floating gate polycrystalline layer, and the continuous tunneling oxide layer being formed on the substrate and on the floating gate polycrystalline layer; wherein a substrate region located at one side of the floating gate polycrystalline layer is a first substrate region, and the first substrate region is configured to form a doped source region; a substrate region located at the other side of the floating gate polycrystalline layer is a second substrate region, and the second substrate region is configured to form a doped drain region;

forming a continuous non-conductive layer on the tunneling oxide layer in the first substrate region, the non-conductive layer extending onto the tunneling oxide layer located at a side wall of the floating gate polycrystalline layer; and forming a polysilicon layer on the tunneling oxide layer to form a control gate as a wordline of the flash device.

A flash device is provided, including:

a substrate;

a floating gate polycrystalline layer located on the substrate;

a floating gate oxide layer located between the substrate and the floating gate polycrystalline layer;

a tunneling oxide layer located on the substrate and on the floating gate polycrystalline layer; the substrate including a first substrate region having a doped source region and located at one side of the floating gate polycrystalline layer, and a second substrate region having a doped drain region and located at the other side of the floating gate polycrystalline layer;

a non-conductive layer located on the tunneling oxide layer in the first substrate region and extending onto the tunneling oxide layer located at a side wall of the floating gate polycrystalline layer; and a control gate located on the tunneling oxide layer in the second substrate region and extending onto a portion of the tunneling oxide layer located on the floating gate polycrystalline layer.

One or more embodiments of the present disclosure will be described in detail in the following figures and description. Other features, objects and advantages of this application will become more apparent from the description, drawings and claims.

BRIEF DESCRIPTION OF THE DRAWINGS

In order to better describe and illustrate the embodiments and/or examples of the inventions disclosed herein, one or more figures can be referred to. The additional details or examples for illustrating the drawings should not be deemed

DETAILED DESCRIPTION OF THE EMBODIMENTS

In order to make the objects, technical solutions, and advantages of the present disclosure more thorough, the present disclosure will be further illustrated in detail with reference to the accompanying drawings and embodiments. It should be understood that the specific embodiments described herein are only used to explain the present disclosure, but not to limit the present disclosure.

Figure 2:
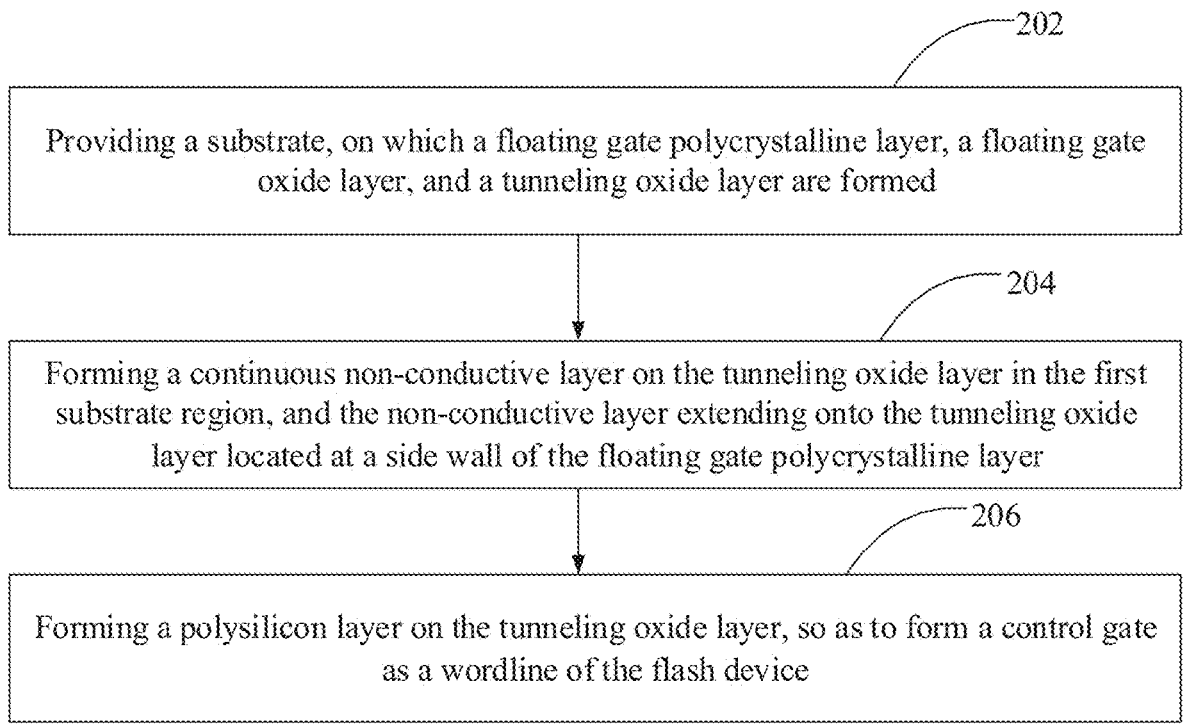
FIG. 2 is a flowchart showing a method of manufacturing a flash device according to an embodiment.

FIG. 2 is a flowchart showing a method of manufacturing a flash device according to an embodiment. The flash in the embodiment of the present disclosure can be the flash of SST series.

Referring to FIG. 2, the method of manufacturing the flash device includes the following steps.

At step 202, a substrate is provided, on which a floating gate polycrystalline layer, a floating gate oxide layer, and a tunneling oxide layer are formed.

Figure 3:
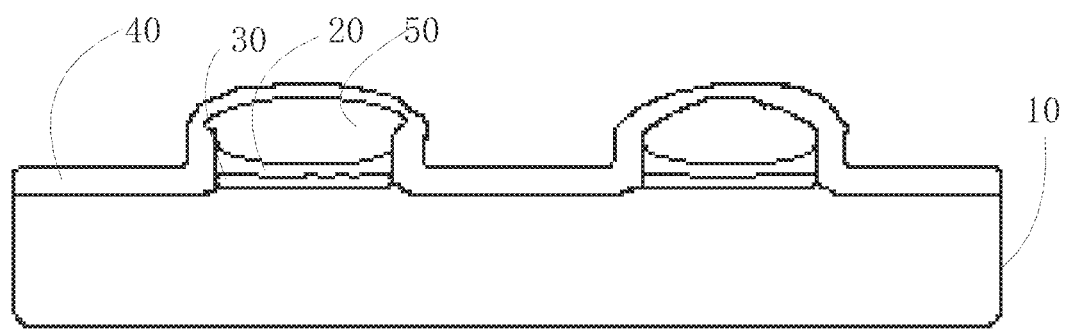
FIG. 3 is a schematic diagram of a substrate according to an embodiment.

Specifically, in the embodiment shown in FIG. 3, the flash device includes MOS devices arranged side-by-side in pairs. Each MOS device includes a substrate 10, a floating gate polycrystalline layer 20 formed on the substrate 10, a floating gate oxide layer 30 formed between the substrate 10 and the floating gate polycrystalline layer 20, and a tunneling oxide layer 40 formed on the floating gate polycrystalline layer 20 and on the substrate 10. A substrate region located at one side of the floating gate polycrystalline layer 20 is a first substrate region, and the first substrate region is configured to form a doped source region. A substrate region located at the other side of the floating gate polycrystalline layer 20 is a second substrate region, and the second substrate region is configured to form a doped drain region. The tunneling oxide layer 40 in the second substrate region is configured to load a voltage when erasing data. The floating gate polycrystalline layer 20 is configured to write data, and the tunneling oxide layer 40 is configured to erase data. In this embodiment, the first substrate region is a substrate region between the two MOS devices, and the second substrate region is a substrate region outside the two MOS devices.

Specifically, a field oxide layer 50 is further formed on the substrate 10. The field oxide layer 50 is formed between the floating gate polycrystalline layer 20 and the tunneling oxide layer 40.

At step 204, a continuous non-conductive layer is formed on the tunneling oxide layer in the first substrate region, and the non-conductive layer extends onto the tunneling oxide layer located at a side wall of the floating gate polycrystalline layer.

Figure 4:
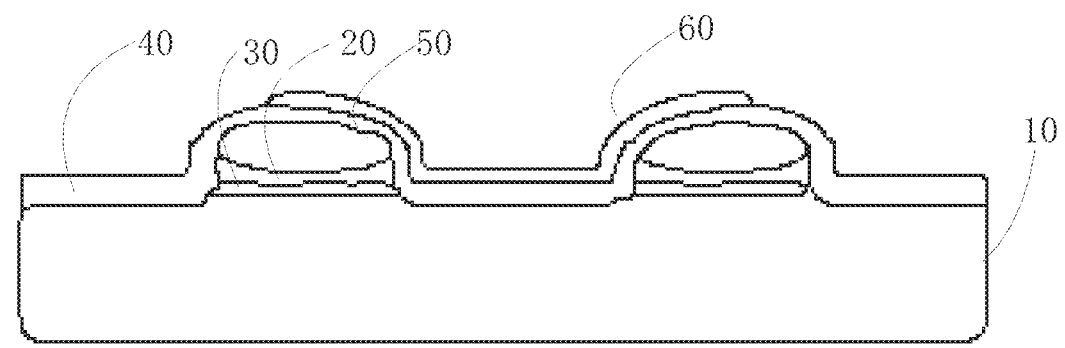
FIG. 4 is a schematic diagram of a structure in which a non-conductive layer is formed according to an embodiment.

Specifically, as shown in FIG. 4, the non-conductive layer 60 is formed on the tunneling oxide layer 40 in the first substrate region, and extends onto the tunneling oxide layer 40 located at the side wall of the floating gate polycrystalline layer 20.

Further, the non-conductive layer can be formed on the tunneling oxide layer in the first substrate region, and can extend onto a portion of the tunneling oxide layer located on the floating gate polycrystalline layer. An end of the non-conductive layer on the floating gate polycrystalline layer is tangent to an end of the subsequently formed control gate on the floating gate polycrystalline layer.

Furthermore, the non-conductive layer can also be formed on the tunneling oxide layer in the first substrate region, and can extend onto the portion of the tunneling oxide layer located on the floating gate polycrystalline layer. The non-conductive layer and the subsequently formed control gate have an overlapping region on the floating gate polycrystalline layer. This embodiment is in this situation.

The non-conductive layer can specifically be a silicon nitride (SiN) layer. A thickness of the silicon nitride (SiN) layer can be 300 Å (Ångstrom). Ångstrom is a metric unit of thickness, where 1 Å (Ångstrom)=$10^{-10}$ m. Since the first substrate region is configured to form the doped source region, and the doped source region is actually provided with a non-conductive silicide-metal blocking layer, the likewise non-conductive silicon nitride layer having a thickness of 300 Å and formed in the first substrate region barely affects the doped source region formed by a subsequent implantation.

When the non-conductive layer and the subsequently formed control gate have an overlapping region on the floating gate polycrystalline layer, the lithography mask used in forming the non-conductive layer can be the lithography mask used in the lithography of the doped source region, thereby reducing the costs of the lithography mask.

The etching process after the lithography of the non-conductive layer adopts a wet etching process, such as hot phosphoric acid. After such non-conductive layer is formed, the removing processes of the photoresist can be simultaneously performed on the same working table (generally in another acid tank), thereby further reducing the costs.

At step 206, a polysilicon layer is formed on the tunneling oxide layer, so as to form a control gate as a wordline of the flash device.

Figure 5:
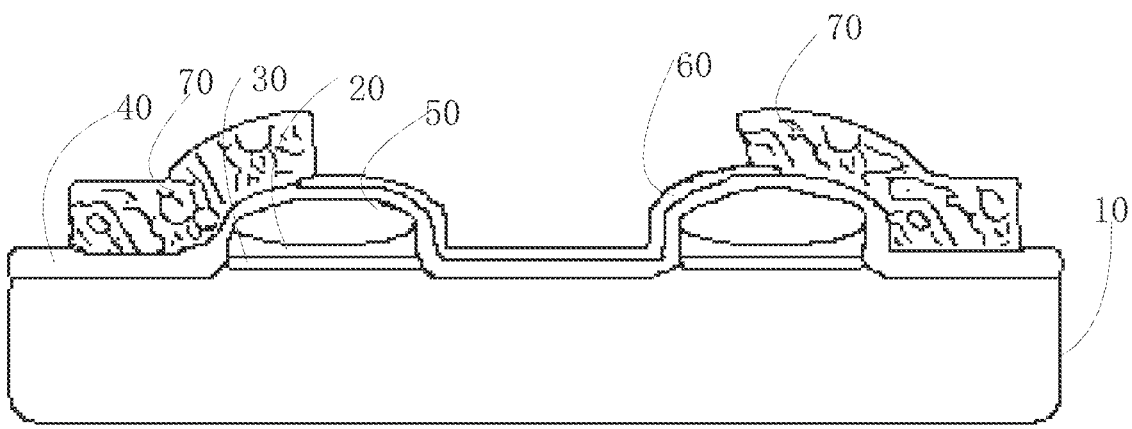
FIG. 5 is a schematic diagram of a structure in which a wordline layer is formed according to an embodiment.

Specifically, as shown in FIG. 5, the control gate 70 is formed on the tunneling oxide layer 40 in the second substrate region and extends onto the tunneling oxide layer 40 located on a portion of the floating gate polycrystalline layer 20. As described above, the non-conductive layer 60 is formed on the tunneling oxide layer 40 in the second substrate region, and extends onto the tunneling oxide layer 40 located at the side wall of the floating gate polycrystalline layer 20, thereby achieving the isolation effect on the residual polysilicon. Further, the non-conductive layer 60 can be formed on the tunneling oxide layer 40 in the second substrate region, and can extend onto the tunneling oxide layer 40 located on the floating gate polycrystalline layer 20. An end of the non-conductive layer 60, located on the floating gate polycrystalline layer 20, is tangent to an end of the control gate 70, located on the floating gate polycrystalline layer 20, so that the non-conductive layer 60 can not only isolate the influence of the polysilicon residue on the bottom structure of the floating gate polycrystalline layer 20, but also isolate the influence of the polysilicon residue on the top of the floating gate polycrystalline layer 20. But this process is comparably difficult in implementation due to the strict requirements on orientation and alignment. Therefore, further, the non-conductive layer 60 can extend onto the overlapping region on the floating gate polycrystalline layer 20, where the non-conductive layer 60 overlaps the control gate 70. In such a way, on the one hand, the isolation effect is better, and on the other hand, the non-conductive layer 60 can be formed using the same lithography mask as the doped source region, thereby reducing the costs of the processes. This embodiment is in this situation.

According to the above-mentioned method of manufacturing the flash device, since the non-conductive layer is formed on the tunneling oxide layer 40 in the first substrate region and extends onto the tunneling oxide layer 40 located at the side wall of the floating gate polycrystalline layer 20, so that the polysilicon residue subsequently generated for forming the wordline can be formed on the non-conductive layer 60, the method does not need to expend time and costs to remove the polysilicon residue. In such a way, in the subsequent process, the residual poly silicon formed by forming the wordline will be formed on the non-conductive layer 60. In addition, due to the insulation effect of the non-conductive layer 60, the polysilicon residue on the non-conductive layer 60 will not affect the structure at the bottom of the floating gate polycrystalline layer 20 at the side proximate to the first substrate region. Therefore, the non-conductive layer 60 formed by the method isolates the influence of the polysilicon residue formed at the bottom of the floating gate polycrystalline layer 20 on the data-erasing or data-writing performance of the flash device. Moreover, using the non-conductive layer to isolate the polysilicon residue has a simplified process, reduced time and economic costs, which will not damage either the active region, or the contours of the polysilicon structures of the wordline, the floating gate layer 20, and the like.

Moreover, in general, there is a certain crossover region in the polysilicon structure formed by the floating gate polycrystalline layer 20 and the control gate 70 corresponding to the floating gate polycrystalline layer 20 in the flash device. However, generally for the crossover regions formed by adjacent floating gate polycrystalline layers 20 and the control gates 70 corresponding to the floating gate polycrystalline layers 20, since the alignment process can cause some deviations in position, the crossover regions formed by the adjacent floating gate polycrystalline layers 20 and the control gates 70 corresponding to the floating gate polycrystalline layers 20 may relatively shift, which can cause a change in its capacitance coupling ratio. In this embodiment, due to the presence of the non-conductive layer 60 and the overlap of the non-conductive layer 60 and the control gate 70, that is, the non-conductive layer 60 being between the floating gate polycrystalline layer 20 and the corresponding control gate 70, and further due to the high dielectric constant of the non-conductive layer 60, the substantial crossover region between the floating gate polycrystalline layer 20 and the corresponding control gate 70 is determined by the non-conductive layer 60. Therefore, even if the positions of the floating gate polycrystalline layer 20 and the control gate 70 corresponding to the floating gate polycrystalline layer 20 have shifted, no change in the capacitive coupling ratio will be caused, as long as the position of the non-conductive layer 60 is fixed.

The embodiments of the present disclosure further provide a flash device, as shown in FIG. 5, including: a substrate 10, a floating gate polycrystalline layer 20, a floating gate oxide layer 30, a tunneling oxide layer 40, a non-conductive layer 60, and a control gate 70. The floating gate polycrystalline layer 20 is located on the substrate 10. The floating gate oxide layer 30 is located between the substrate 10 and the floating gate polycrystalline layer 20, and is configured to write data. The tunneling oxide layer 40 is located on the floating gate polycrystalline layer 20 and on the substrate 10, and is configured to erase data. The substrate 10 includes a first substrate region having a doped source region and located at one side of the floating gate polycrystalline layer 20, and a second substrate region having a doped drain region and located at the other side of the floating gate polycrystalline layer 20. The tunneling oxide layer 40 in the second substrate region is configured to load a voltage when erasing data. The non-conductive layer 60 is located on the tunneling oxide layer 40 in the first substrate region and extends onto the tunneling oxide layer 40 located at a side wall of the floating gate polycrystalline layer 20, The control gate 70 is located on the tunneling oxide layer 40 in the second substrate region and extends onto a portion of the tunneling oxide layer 40 located on the floating gate polycrystalline layer 20. The control gate 70 is used as the wordline of the flash device.

As shown in FIG. 5, in this embodiment, the flash device includes MOS devices arranged side-by-side in pairs. Each MOS device is the above-mentioned flash device. The first substrate region is a substrate region between the two MOS devices, and the second substrate region is a substrate region outside the two MOS devices.

Specifically, as shown in FIG. 5, a field oxide layer 50 is further formed on the substrate 10. The field oxide layer 50 is located between the floating gate polycrystalline layer 20 and the tunneling oxide layer 40.

Specifically, as shown in FIG. 5, the control gate 70 is located on the tunneling oxide layer 40 in the second substrate region and extends onto the tunneling oxide layer 40 located on a portion of the floating gate polycrystalline layer 20. As described above, the non-conductive layer 60 is located on the tunneling oxide layer 40 in the second substrate region, and extends onto the tunneling oxide layer 40 located at the side wall of the floating gate polycrystalline layer 20, thereby achieving the isolation effect on the residual polysilicon. Further, the non-conductive layer 60 can be located on the tunneling oxide layer 40 in the second substrate region, and can extend onto the tunneling oxide layer 40 located on the floating gate polycrystalline layer 20. An end of the non-conductive layer 60, located on the floating gate polycrystalline layer 20, is tangent to an end of the control gate 70, located on the floating gate polycrystalline layer 20, so that the non-conductive layer 60 can not only isolate the influence of the polysilicon residue on the bottom structure of the floating gate polycrystalline layer 20, but also isolate the influence of the polysilicon residue on the top of the floating gate polycrystalline layer 20. But this process is comparably difficult in implementation due to the strict requirements on orientation and alignment. Therefore, further, as shown in FIG. 5, the non-conductive layer 60 can extend onto the overlapping region on the floating gate polycrystalline layer 20, where the non-conductive layer 60 overlaps the control gate 70. In such a way, on the one hand, the isolation effect is better, and on the other hand, the non-conductive layer 60 can be formed using the same lithography mask as the doped source region, thereby reducing the costs of the processes. This embodiment is in this situation.

According to the above-mentioned flash device, the non-conductive layer 60 is located on the tunneling oxide layer 40 in the first substrate region, and extends onto the tunneling oxide layer 40 at the side wall of the floating gate polycrystalline layer 20. In this way, even if there is polysilicon residue on the non-conductive layer 60, the polysilicon residue on the non-conductive layer 60 will not affect the structure at the bottom of the floating gate polycrystalline layer 20 at the side proximate to the first substrate region due to the insulation effect of the non-conductive layer 60. Therefore, the presence of the non-conductive layer 60 of the flash device according to the present disclosure isolates the influence of the polysilicon residue formed at the bottom of the floating gate polycrystalline layer 20 on the data-erasing or data-writing performance of the flash device. Moreover, using the non-conductive layer 60 to isolate the polysilicon residue has a simplified process, reduced time and economic costs, which will not damage either the active region, or the contours of the polysilicon structures of the wordline, the floating gate layer 20, and the like.

Furthermore, in general, there is a certain crossover region in the polysilicon structure formed by the floating gate polycrystalline layer 20 and the control gate 70 corresponding to the floating gate polycrystalline layer 20 in the flash device. However, generally for the crossover regions formed by adjacent floating gate polycrystalline layers 20 and the control gates 70 corresponding to the floating gate polycrystalline layers 20, since the alignment process can cause some deviations in position, the crossover regions formed by the adjacent floating gate polycrystalline layers 20 and the control gates 70 corresponding to the floating gate polycrystalline layers 20 may relatively shift, which can cause a change in its capacitance coupling ratio. In this embodiment, due to the presence of the non-conductive layer 60 and the overlap of the non-conductive layer 60 and the control gate 70, that is, the non-conductive layer 60 being between the floating gate polycrystalline layer 20 and the corresponding control gate 70, and further due to the high dielectric constant of the non-conductive layer 60, the substantial crossover region between the floating gate polycrystalline layer 20 and the corresponding control gate 70 is determined by the non-conductive layer 60. Therefore, even if the positions of the floating gate polycrystalline layer 20 and the control gate 70 corresponding to the floating gate polycrystalline layer 20 have shifted, no change in the capacitive coupling ratio will be caused, as long as the position of the non-conductive layer 60 is fixed.

Figure 1:
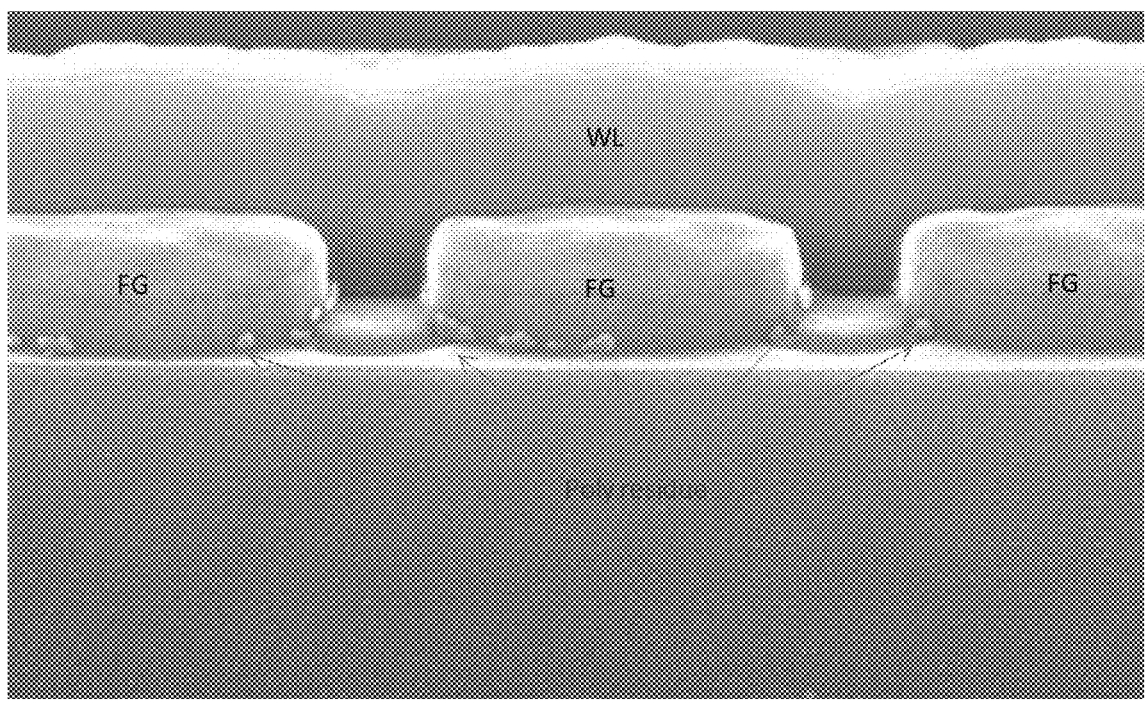
FIG. 1 is a schematic diagram showing polysilicon residue, observed by a microscope, of a flash device in the prior art.

It should be noted that, in order to more intuitively observe the structure of the non-conductive layer in the flash device, the view directions of the schematic diagrams shown in FIGS. 3 to 5 of the embodiments of the present disclosure are perpendicular to the view direction of FIG. 1.

All technical features of the above-mentioned embodiments can be combined arbitrarily. In order to make the description concise, all possible combinations of the technical features in the above-mentioned embodiments are not exhaustively described. However, as long as there is no contradiction in the combination of these technical features, these combinations should be considered within the scope of this description.

The above-mentioned embodiments only express a few implementations of the present disclosure, and the description is comparably specific and detailed, but it should not be interpreted as a limitation on the scope of the present disclosure. It should be pointed out that for those of ordinary skill in the art, without departing from the concept of the present disclosure, several modifications and improvements can be made, and these all fall within the protection scope of the present disclosure. Therefore, the protection scope of the disclosure should be subject to the appended claims.

What is claimed is:

1. A method of manufacturing a flash device, comprising:
providing a substrate, a floating gate polycrystalline layer, a floating gate oxide layer, and a tunneling oxide layer being formed on the substrate; the floating gate polycrystalline layer being formed on the substrate, the floating gate oxide layer being formed between the substrate and the floating gate polycrystalline layer, and the tunneling oxide layer, that is continuous, being formed on the substrate and on the floating gate polycrystalline layer; wherein a substrate region located at one side of the floating gate polycrystalline layer is a first substrate region, and the first substrate region is configured to form a doped source region; a substrate region located at the other side of the floating gate polycrystalline layer is a second substrate region, and the second substrate region is configured to form a doped drain region;
forming a continuous non-conductive layer on the tunneling oxide layer in the first substrate region, the non-conductive layer extending onto the tunneling oxide layer located at a side wall of the floating gate polycrystalline layer; and
forming a polysilicon layer on the tunneling oxide layer to form a control gate as a wordline of the flash device;
wherein a lithography mask used in forming the continuous non-conductive layer is a lithography mask used in lithography of the doped source region.

2. The method of claim 1, wherein
the non-conductive layer is formed on the tunneling oxide layer in the first substrate region, and extends onto a portion of the tunneling oxide layer located on the floating gate polycrystalline layer.

3. The method of claim 2, wherein an end of the non-conductive layer on the floating gate polycrystalline layer is tangent to an end of the control gate on the floating gate polycrystalline layer.

4. The method of claim 2, wherein
the non-conductive layer and the control gate have an overlapping region on the floating gate polycrystalline layer.

5. The method of claim 1, wherein the forming the continuous non-conductive layer comprises depositing a non-conductive material on the tunneling oxide layer, and etching off superfluous non-conductive material by a wet etching process, to form the continuous non-conductive layer.

6. The method of claim 5, wherein an etchant of the wet etching process is hot phosphoric acid.

7. The method of claim 5, wherein after forming the continuous non-conductive layer, a removing process of photoresist corresponding to the non-conductive layer and the wet etching process are performed on a same working table.

8. The method of claim 1, wherein the non-conductive layer is a silicon nitride layer, and the silicon nitride layer has a thickness of 300 Å.

9. A flash device, comprising:
a substrate;
a floating gate polycrystalline layer located on the substrate;
a floating gate oxide layer located between the substrate and the floating gate polycrystalline layer;
a tunneling oxide layer located on the substrate and on the floating gate polycrystalline layer; the substrate comprising a first substrate region having a doped source region and located at one side of the floating gate polycrystalline layer, and a second substrate region having a doped drain region and located at the other side of the floating gate polycrystalline layer;

a non-conductive layer located on the tunneling oxide layer in the first substrate region and extending onto the tunneling oxide layer located at a side wall of the floating gate polycrystalline layer; and a control gate located on the tunneling oxide layer in the second substrate region and extending onto a portion of the tunneling oxide layer located on the floating gate polycrystalline layer;

wherein a lithography mask used in forming the non-conductive layer is a lithography mask used in lithography of the doped source region.

10. The flash device of claim 9, wherein the non-conductive layer is located on the tunneling oxide layer in the first substrate region, and extends onto a portion of the tunneling oxide layer located on the floating gate polycrystalline layer.

11. The flash device of claim 10, wherein an end of the non-conductive layer on the floating gate polycrystalline layer is tangent to an end of the control gate on the floating gate polycrystalline layer.

12. The flash device of claim 10, wherein the non-conductive layer is located on the tunneling oxide layer in the first substrate region, and extends onto the portion of the tunneling oxide layer located on the floating gate polycrystalline layer, and the non-conductive layer and the control gate have an overlapping region on the floating gate polycrystalline layer.

13. The flash device of claim 9, wherein the flash device comprises MOS devices arranged side-by-side in pairs, and each of the MOS devices is the flash device of claim 10;

the first substrate region is a substrate region between the two MOS devices, and the second substrate region is a substrate region outside the two MOS devices.

14. The flash device of claim 9, wherein the non-conductive layer is a silicon nitride layer, and the silicon nitride layer has a thickness of 300 Å.

* * * * *